United States Patent [19]
Kwiram et al.

[11] Patent Number: 5,528,146
[45] Date of Patent: Jun. 18, 1996

[54] METHOD AND APPARATUS FOR DETECTING ELECTRON SPIN TRANSITIONS IN ZERO FIELD

[75] Inventors: Alvin W. Kwiram, Seattle, Wash.; Jerzy Krzystek, Bronx, N.Y.

[73] Assignee: The University of Washington, Seattle, Wash.

[21] Appl. No.: 381,523

[22] Filed: Jan. 31, 1995

[51] Int. Cl.$^6$ .................................................. G01R 33/20
[52] U.S. Cl. ............................................ 324/316; 324/307
[58] Field of Search .................................... 324/300, 316, 324/307, 309, 318, 317, 314; 128/653.2

[56] References Cited

U.S. PATENT DOCUMENTS

| | | | |
|---|---|---|---|
| 3,585,494 | 6/1971 | Bozanic et al. | 324/316 |
| 3,829,760 | 8/1974 | Bozanic et al. | 324/316 |
| 4,573,015 | 2/1986 | Abe et al. | 324/309 |
| 4,719,425 | 1/1988 | Ettinger | 324/316 |
| 4,887,034 | 12/1989 | Smith | 324/307 |
| 4,891,593 | 1/1990 | Lurie et al. | 324/307 |
| 5,111,145 | 5/1992 | Sepponen | 324/316 |
| 5,254,950 | 10/1993 | Fan et al. | 324/322 |

FOREIGN PATENT DOCUMENTS

| | | |
|---|---|---|
| 0570592A1 | 11/1993 | European Pat. Off. . |
| 155209 | 12/1980 | Germany . |
| 234936A1 | 2/1985 | Germany . |
| 1606921A1 | 7/1987 | U.S.S.R. . |
| 1728753A1 | 3/1989 | U.S.S.R. . |
| 9403824 | 2/1994 | WIPO . |

*Primary Examiner*—Sandra L. O'Shea
*Assistant Examiner*—Raymond Y. Mah
*Attorney, Agent, or Firm*—Christensen, O'Connor, Johnson & Kindness

[57] ABSTRACT

A method and apparatus for detecting spin transitions for a paramagnetic substance that are induced in the absence of a magnetic field. The method includes the steps of placing a substance under investigation in a high magnetic field. The magnetic field is then rapidly turned off and then reenergized. An ESR signal obtained after the magnetic field is reenergized is used as a baseline. This process is then repeated except that when the magnetic field strength is reduced to zero, the substance is exposed to radio frequency (rf) electromagnetic energy. Any spin transitions induced in the substance by absorption of the rf energy are detected by comparing the resulting ESR signal, detected when the magnetic is reenergized, to the baseline ESR signal.

9 Claims, 9 Drawing Sheets

METHOD AND APPARATUS FOR DETECTING ELECTRON SPIN TRANSITIONS IN ZERO FIELD

This invention was made with government support under grant number CHE-9014898A01 awarded by the National Science Foundation. The government has certain rights in the invention.

FIELD OF THE INVENTION

The present invention relates generally to the field of detecting spin transitions in chemical substances and, in particular, to a method and apparatus for detecting spin transitions of paramagnetic substances.

BACKGROUND OF THE INVENTION

In every molecular structure, there exists a number of atoms bonded together by electrons that surround the nuclei of the atoms. Each molecule has discrete electronic energy levels and each such level has a characteristic spin value. The theory of quantum mechanics has shown that these energies do not vary continuously. Instead, the energy of an electron can only change in indivisible quantum steps. Each electron surrounding a nucleus is said to exist at one of several possible energy levels that are an integer number of quanta apart in energy. The energy of an electron will not increase to a higher level until the electron absorbs energy equal to the difference between the electron's current energy level and the higher energy level. Knowledge of the energy levels of electrons and the differences between the electron energy levels reveal a great deal of information regarding the structure of a molecule, which can help a scientist better understand the physical position of atoms within the molecule, the strength of the chemical bonds between the atoms, etc.

One of the most useful methods for determining the energy levels of electrons is called electron spin resonance (ESR). Using this method, a single crystal of a material being studied is placed in a strong magnetic field. The sample is then exposed to a high-frequency electromagnetic signal. A detector is used to measure the extent to which the electromagnetic signal is absorbed by the sample. The absorption versus the strength of the magnetic field is plotted to produce an ESR spectrum of the molecules in the material.

Despite the success of the ESR technique, it suffers from several drawbacks that limit its usefulness in detecting spin transitions for all substances. First, in order to obtain the maximum geometric information from the ESR technique, the sample under investigation must be in the form of a single crystal. For many substances, it is difficult, if not impossible, to obtain single crystals. For example, many biological materials cannot be crystallized. Secondly, in a standard ESR experiment, the absorption frequencies for the magnetic resonance transitions change depending on the crystal's orientation in the magnetic field. For chemical substances such as powders, the molecular fragments are randomly oriented within the magnetic field, which makes interpretation of the spectral information difficult or impossible. Therefore, there is a need for a diagnostic tool or technique that allows a researcher to determine the magnetic resonance parameters of a paramagnetic substance accurately without requiring that the sample be available in crystalline form.

SUMMARY OF THE INVENTION

In order to detect spin transition occurring in a paramagnetic, non-crystallized substance, the present invention utilizes a novel combination of zero field and high field ESR techniques referred to as field cycling. The sample is first exposed to a high magnetic field for a period of time before the magnetic field is rapidly switched off for a period of time and rapidly reenergized. After the magnetic field has been reenergized, an ESR signal for the substance is determined for use as a baseline. This process is then repeated, except that during the brief period when the substance is not experiencing a magnetic field, the substance is exposed to radio frequency (rf) energy. If the frequency of the applied energy is in resonance with the energy of an allowed spin transition, the ESR signal measured when the magnetic field is reenergized will differ from the baseline ESR signal. Therefore, by varying the frequency of the electromagnetic energy applied when the magnetic field is switched off and measuring the ESR signal after the magnetic field has been reenergized, the frequency of the zero field spin transitions for the substance under investigation can be determined. Because the rf energy is applied at zero field, it is not necessary that the sample be crystallized because the orientation of the molecular fragment in the absence of a magnetic field is not relevant. Therefore, the present invention makes detection and interpretation of spin transitions in non-crystallized samples such as biological materials, powders, or matrix isolated substances (species) much easier.

The present invention is also directed to a method for simplifying the zero field spectrum, and for identifying and analyzing the frequencies of spin transitions, by pumping the zero field spin transitions in the substance under investigation with two radio frequencies in the absence of a magnetic field. When the magnetic field is reduced to zero, rf energy having a frequency substantially equal to the frequency of a transition of the maximum allowed frequency is applied to the substance. A second radio frequency is also applied to the substance. By analyzing the response of the signal (obtained when the substance is pumped by the first radio frequency) to the spin transitions induced by the second radio frequency field, one can establish the disposition of the electron-nuclear spin energy levels.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
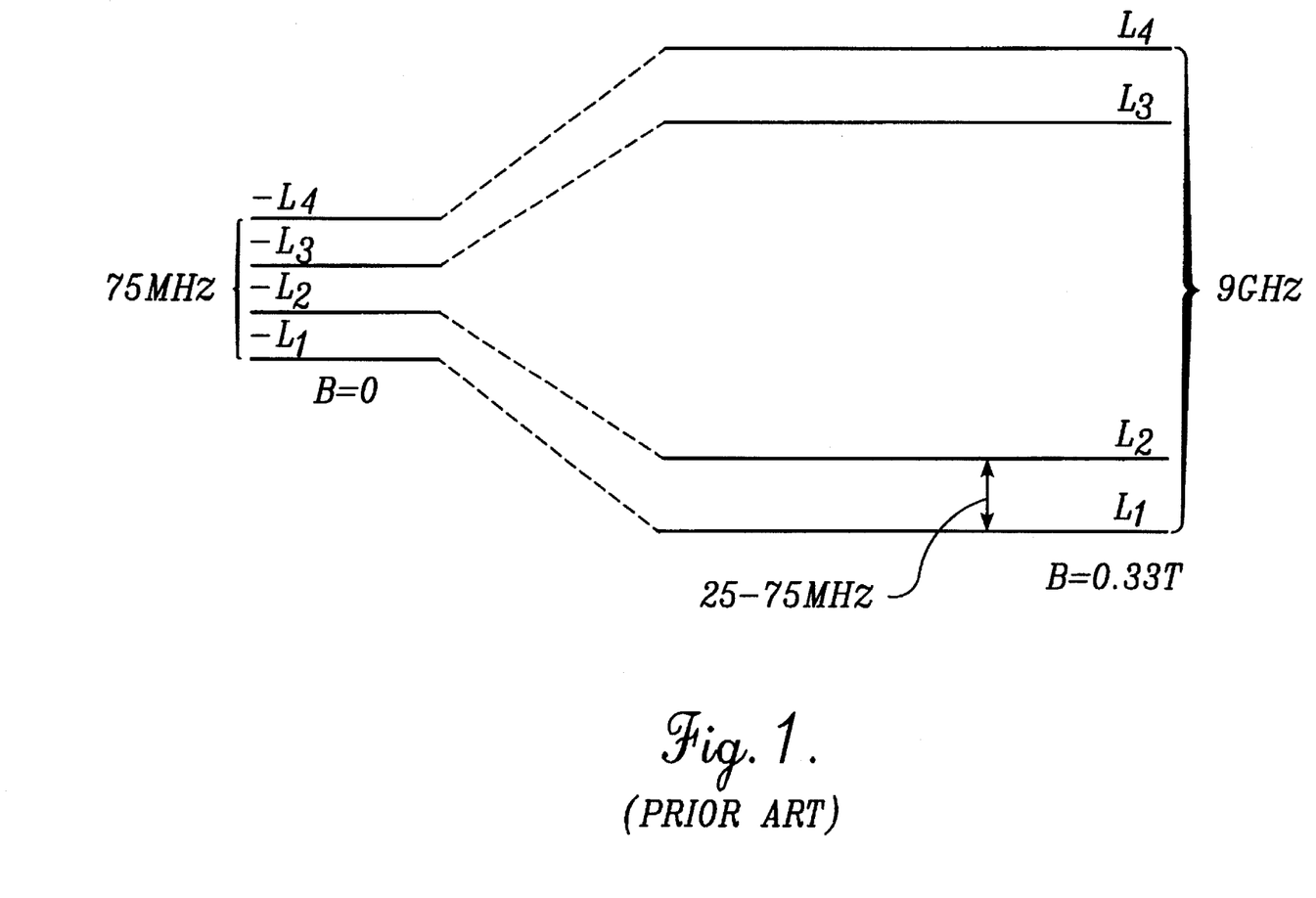
FIG. 1 is a conventional energy level diagram for a single unpaired electron/proton pair in the absence of a magnetic field (a) and in a high magnetic field (b)

Referring now to FIG. 1, an energy level diagram for a chemical substance having a single proton and a single unpaired electron has four energy levels $L_1$, $L_2$, $L_3$ or $L_4$. In the absence of a magnetic field (B=0), the electron or proton can undergo any one of six possible transitions between the four different energy levels. The transitions are generally referred to as "spin" transitions. The six possible spin transitions are from level $L_1$ to levels $L_2$, $L_3$ or $L_4$, from level $L_2$ to levels $L_3$ or $L_4$, or from level $L_3$ to level $L_4$. The energy associated with an electron transition is related to a corresponding frequency through the equation:

$$E = h\nu \quad (1)$$

wherein E is the energy of the transition, $h$ is Planck's constant, and $\nu$ is the frequency. When the electron absorbs an electromagnetic signal having a frequency corresponding to the energy difference between two levels, the electron will "jump" from the lower level to the higher level. Similarly, an electron falls from a higher energy level to a lower level by emitting an electromagnetic signal having a frequency corresponding to the energy of the transition. A transition of an electron from one energy level to another in a magnetic field is generally referred to as a "Zeeman" transition. The largest energy level difference for the four levels shown in FIG. 1 corresponds to the largest level transition, i.e., a jump from $L_1$ level to level $L_4$ or vice versa. By detecting the frequency of the absorbed electromagnetic signal as the electron is pumped from one level to a higher energy level, it is possible to determine the difference between energy levels of the electron spins. By knowing the difference in energy between the levels of electron spins, a scientist can extract important information about the molecular structure of the substance under investigation.

As can be seen at the left hand side of FIG. 1, in the absence of a magnetic field (B=0), the energy of the highest energy transition for an exemplary substance having a single electron/proton pair corresponds to a frequency of approximately 75 MHz. The energies of all the possible spin transitions for this substance in zero field correspond to frequencies in the range of 15–75 MHz.

Each spin transition does not correspond to an exact frequency but rather corresponds to a narrow range of frequencies. The range of frequencies that characterize a spin transition is referred to as the linewidth of the transition. As will be explained in further detail below, it is difficult to detect spin transitions in the absence of a magnetic field, in part because of the smaller energies involved. Even when signals can be detected, analysis is often difficult because the linewidths of the absorption signals give rise to overlapping signals, especially when there are many possible spin transitions (in a limited frequency range).

In order to make the spin transitions easier to detect, it is normal to place the sample under investigation in a high magnetic field. As can be seen at the right-hand side of FIG. 1, when a single electron/proton pair system is placed in a magnetic field (B=0.33 Tesla) the energy differences between the levels increase. The four energy levels split into two pairs. If a solid sample is used, then the energy levels are dependent upon the orientation of the crystal (or crystallites) in the magnetic field. For example, in FIG. 1, levels $L_1$ and $L_2$ remain close together and levels $L_3$ and $L_4$ remain close together. However, as the orientation of the magnetic field is changed relative to the sample, the separation of the various levels will change in general.

To produce an ESR spectrum for a sample in a high magnetic field, the sample is exposed to electromagnetic energy having a frequency of approximately 9 GHz. By plotting the magnitude of the 9 GHz signal at the sample versus the strength of the magnetic field, which is slowly varied over an appropriate range, a characteristic ESR spectrum for the sample is produced. In this microwave frequency range, the linewidth of the absorption signals (a few MHz) is sufficiently small compared to the splitting between the lines (30–90 MHz) so that it is generally possible to detect the individual transitions (e.g., level $L_1$ to level $L_4$ and level $L_2$ to level $L_3$).

Figure 2:
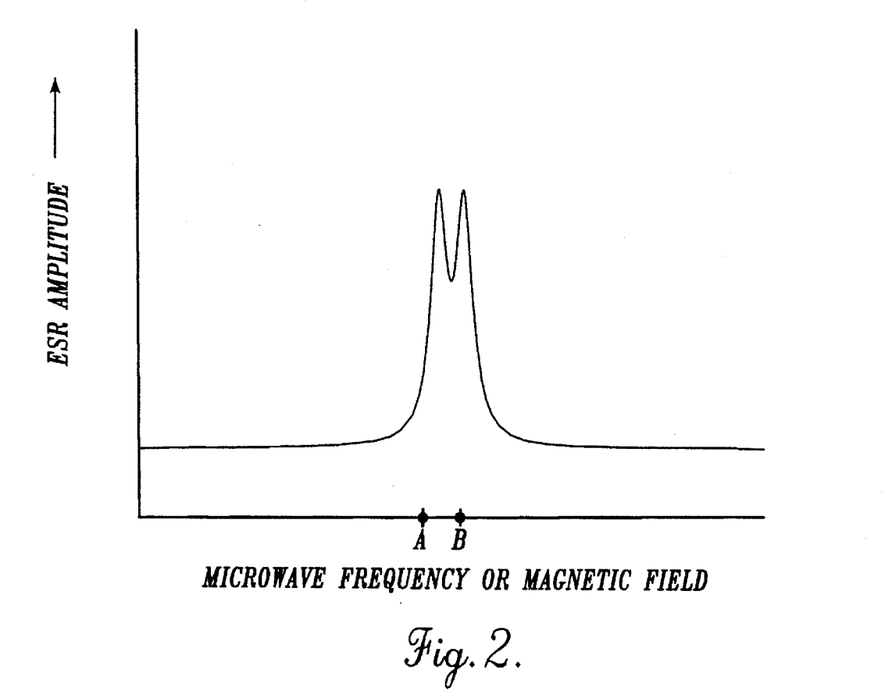
FIG. 2 is a typical ESR spectrum for a single unpaired electron/proton pair in a high magnetic field.

Referring now to FIG. 2, an ESR spectrum of a substance having a single electron/proton pair has two absorption peaks (labeled A and B) indicating the frequency of the allowed transitions. For example, point A marks the frequency corresponding to the energy level transition between level $L_1$ and level $L_4$, while point B marks the frequency of the transition between level $L_2$ and $L_3$.

As indicated above, the energy difference between some of the levels increases when the sample is placed in a high magnetic field; however, the levels do not split evenly. For example, the energy difference between levels $L_4$ and $L_3$ and the energy difference between levels $L_2$ and $L_1$ remain relatively small (i.e., 25–75 MHz at B=0.33 Tesla).

To detect spin transitions between these more closely spaced energy levels with greater precision, a technique called electron nuclear double resonance (ENDOR) was developed. With this technique, the sample is placed in a high magnetic field and exposed to electromagnetic energy having a frequency corresponding to the energy of one of the known ESR transitions. For example, to detect the energy difference for transitions between levels $L_3$ and $L_4$ or levels $L_1$ and $L_2$, the sample under investigation is placed in the magnetic field and exposed to a first electromagnetic signal having a frequency corresponding to either known spin transition for the points labeled A or B in FIG. 2. The sample is then exposed to a second dose of rf energy having a frequency in the range of 1 to 100 MHz. By monitoring the absorption of the electromagnetic energy having the frequency of a known spin transition as the frequency of the second dose of rf energy is swept through the range of 1 to 100 MHz, transitions between levels $L_1$–$L_2$ and $L_3$–$L_4$ can be detected.

Figure 3:
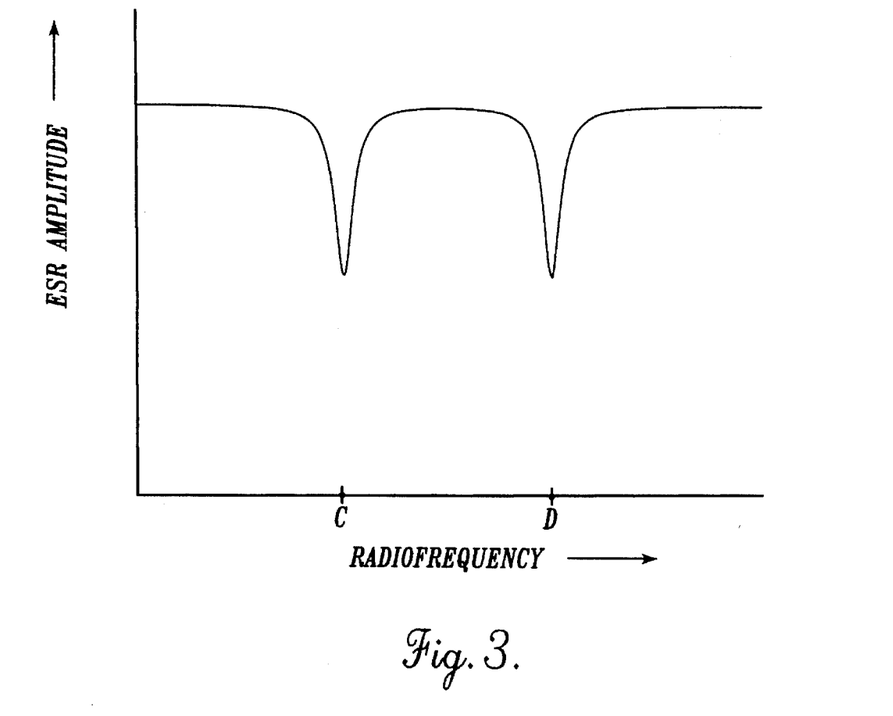
FIG. 3 is a typical spectrum for a single unpaired electron/proton pair that is obtained using a conventional electron nuclear double resonance (ENDOR) technique in a high magnetic field.

As can be seen in FIG. 3, the magnitude of the ESR signal for the single electron/proton pair (substance) changes as the frequency of the applied rf energy is varied. A pair of transitions labeled C and D mark changes in the detected ESR signal, thereby giving an indication of the energy difference between levels $L_1$ and $L_2$ (line C) and levels $L_3$ and $L_4$ (line D). The information contained in the ESR and ENDOR spectra shown in FIGS. 2 and 3 is enough to allow a scientist to determine the difference in energy between the various spin levels.

As described above, the problem with electron spin resonance experiments that are conducted on solid-state materials in a high magnetic field is that the substance under study must be a single crystal in most cases, in order to fully analyze the information (data). However, for many materials, it is difficult or impossible to obtain a crystallized sample for study. It is well known that in the absence of a magnetic field, the frequency of the transitions which occur are unaffected by the orientation of molecules comprising the substance. Therefore, research had been directed to detecting spin transitions in the absence of a magnetic field. However, as was described in connection with FIG. 1, the problem with detecting transitions in the absence of a magnetic field is that the energy of the transition is greatly decreased, which makes it much more difficult to detect those low-energy transitions. Additionally, the linewidth of each spin transition is relatively wide compared to the total frequency range for all possible spin transitions (especially if several protons interact with the unpaired electron). Finally, the number of allowed transitions is greatly increased in zero field.

Figure 4:
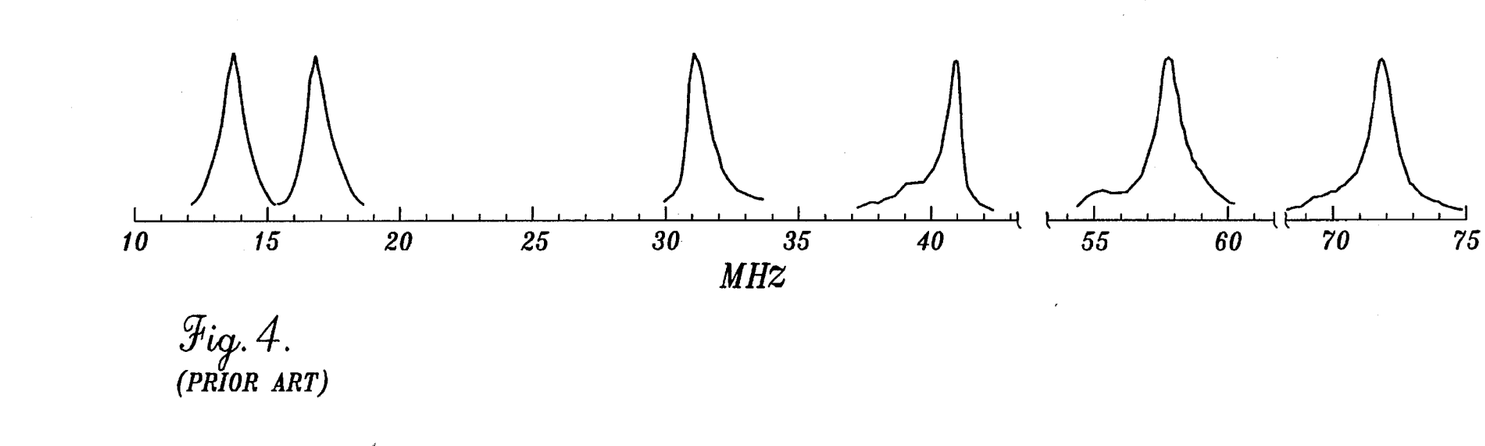
FIG. 4 is an ESR spectrum for a single electron/proton pair obtained in the absence of a magnetic field according to a prior art technique.

FIG. 4 shows a prior art ESR spectrum, made in the absence of a magnetic field, of a substance having a single proton/electron pair. The ESR spectrum was obtained by using four different detectors (sample coils), each of which was designed to work in a relatively narrow, predetermined frequency range. As can be seen, the ESR spectrum shows six absorption peaks corresponding to the six possible spin transitions. While it is possible to detect the spin transitions at zero field for substances having one electron and one proton system, as the number of protons in the substance increases, the number of possible spin transitions increases exponentially.

Figure 5:
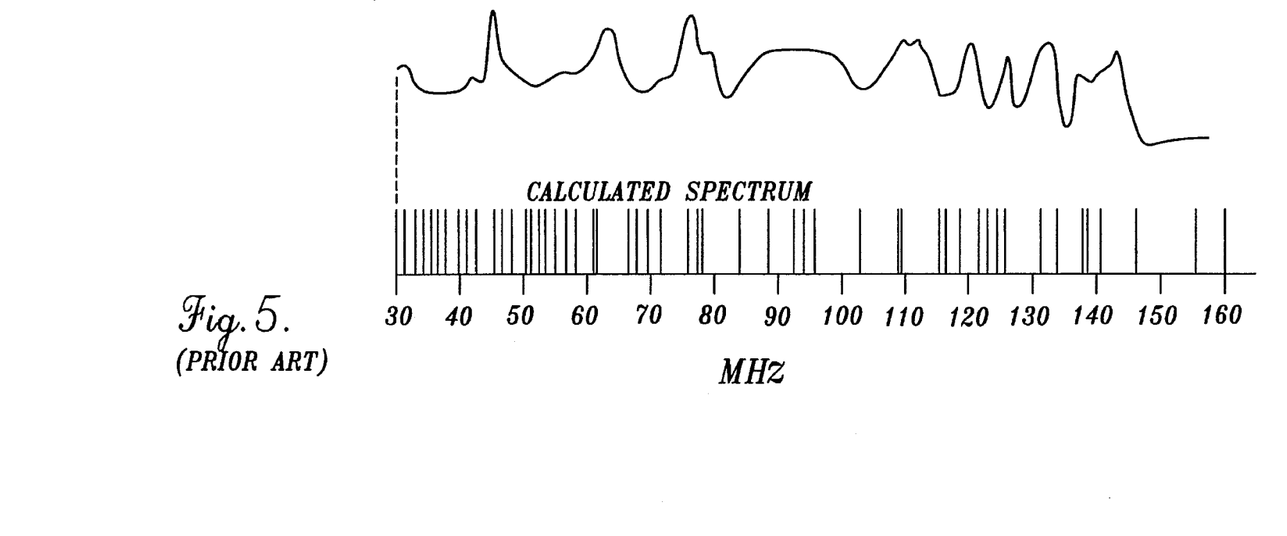
FIG. 5 is an ESR spectrum of a system having three protons and a single electron obtained in the absence of a magnetic field according to a prior art technique.

FIG. 5 illustrates a prior art zero field ESR spectrum that was obtained for a substance having three protons and one unpaired electron. For this type of substance, there are 16 electron energy levels and 120 possible spin transitions. The linewidth of each transition is approximately 1–3 MHz while the frequency of all possible spin transitions lie in the range of 30–160 MHz. Thus, the ESR spectrum appears as virtually a continuous curve, and it is difficult to resolve many of the 120 possible spin transitions, and essentially impossible to analyze.

Figure 6:
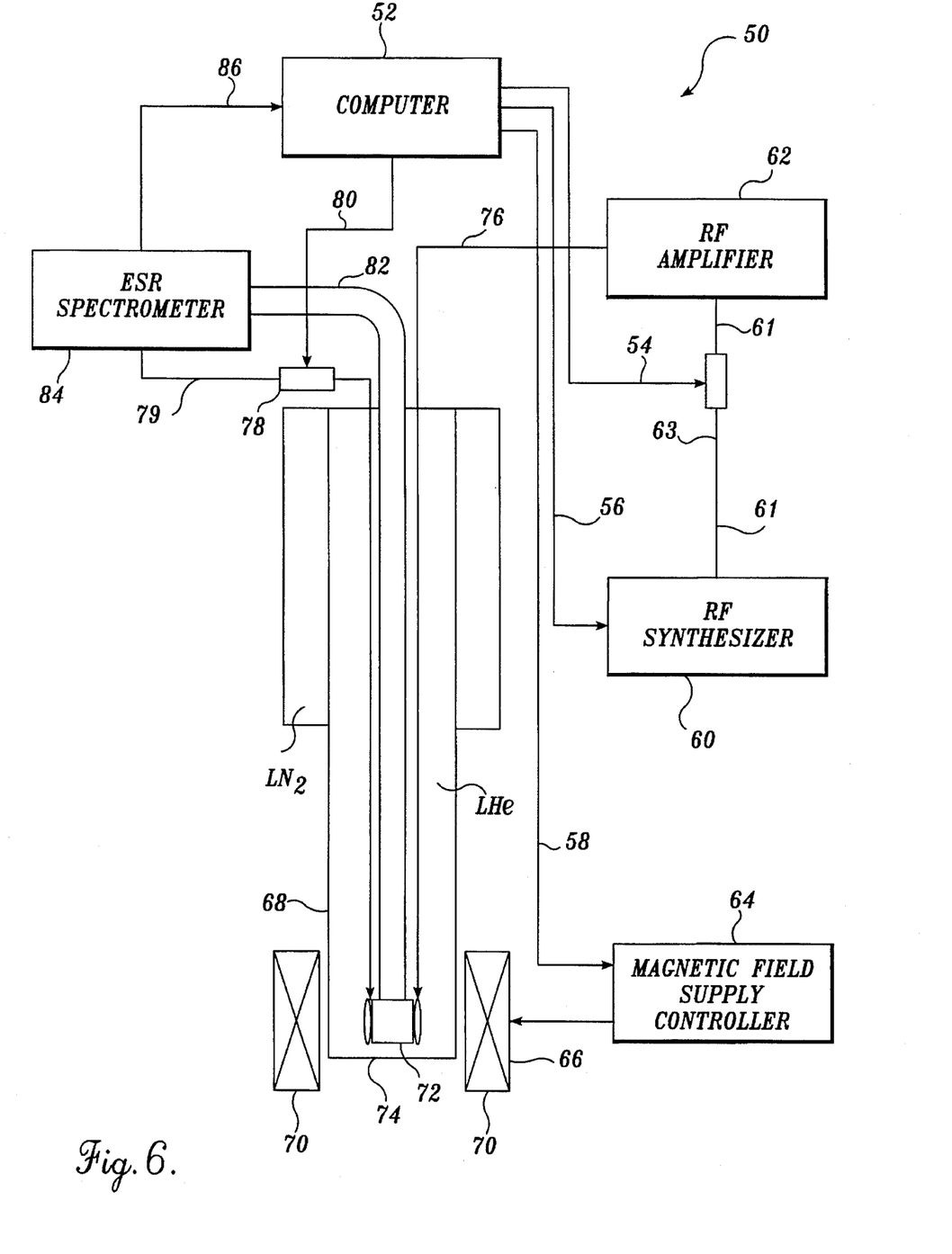
FIG. 6 is a block diagram of an apparatus for detecting spin transitions in the absence of a magnetic field according to the present invention.

Referring now to FIG. 6, a system 50 for detecting spin transitions in zero field according to the present invention includes a computer system 52, a rf synthesizer 60, a rf amplifier 62, a magnetic field supply and controller 64, and an ESR spectrometer 84. The computer system is coupled to the magnetic field supply and controller 64 by a lead 58 and to the rf synthesizer 60 by a lead 56. A lead 61 couples the output of the rf synthesizer 60 to the input of the rf amplifier 62. A rf switch 63 is disposed in the lead 61 between the rf synthesizer 60 and the rf amplifier 62. The rf switch 63 is controlled by the computer system 52 by signals carried on a lead 54.

The chemical sample under investigation is placed in a microwave cavity 72 that is located in a liquid helium cryostat 68. The cryostat is a conventional Dewar type that includes an inner tank filled with liquid helium within an outer tank filled with liquid nitrogen. A pair of rf coils 74 surround the microwave cavity 72 at the bottom of the cryostat 68, inside the inner liquid helium cavity. The rf coils 74 are coupled to an output of the rf amplifier 62 by a lead 76. A pair of electromagnets 70 are disposed outside both microwave cavity 72 and the rf coils 74 external to the cryostat 68. The strength of the magnetic field produced by the electromagnets 70 is controlled by the magnetic field supply and controller 64 using electric currents conveyed by a lead 66. One end of an X-band waveguide 82 extends to the microwave cavity 72 and another end extends out of the cryostat 68, coupled to the ESR spectrometer 84. An output signal produced by the ESR spectrometer 84 is transmitted to an input of the computer system 52 on a lead 86.

Also connected to the ESR spectrometer 84 is a lead 79 that is coupled to a pair of Zeeman modulation coils (not separately shown). The Zeeman modulation coils are located between the microwave cavity 72 and the rf coils 74. The ESR spectrometer generates an alternating electric current that is supplied to the Zeeman modulation coils to set up an oscillating magnetic field around the microwave cavity. This alternating magnetic field is used to increase the sensitivity of the ESR spectrometer which detects the ESR signals in a high magnetic field. The operation of the Zeeman modulation coils is well known to those of ordinary skill in the art of ESR spectrometry and therefore need not be discussed in further detail. To control the oscillating magnetic field, a switch 78 is disposed in the lead 79 that extends between the output of the ESR spectrometer 84 and the Zeeman modulation coils. The switch 78 is controlled by the computer system 52 by signals transmitted on a lead 80 so that the oscillating magnetic field can be turned on or off as desired.

In operation, the computer system 52 uses a novel combination of zero field and high field ESR techniques to detect spin transitions in parmagnetic substances. First, the sample under investigation is exposed to a high-magnetic field produced when computer system 52 causes the magnetic field supply and controller 64 to deliver an electric current over the lead 66 to the pair of electromagnets 70. The ESR spectrometer 84 produces 9 GHz electromagnetic signal energy, which is conveyed through the X-band waveguide 82 into the microwave cavity 72. The magnitude of the 9 GHz electromagnetic energy absorption within the microwave cavity 72 is monitored by the ESR spectrometer 84. The computer system 52 then opens the switch 78 to turn off the oscillating magnetic field and simultaneously causes the magnetic field supply and controller 64 to rapidly turn off the static magnetic field surrounding the microwave cavity 72 for a brief time. The computer system then causes the rf synthesizer 60 to produce rf energy that is transmitted over the lead 61 to an input of the rf amplifier 62. The amplified rf energy is transmitted over the lead 76 from the rf amplifier to the rf coils 74 that surround the microwave cavity. The computer system 52 then interrupts the rf energy by opening switch 63. Next, the computer system causes the static magnetic field to be reenergized and the switch 78 is closed to restart the oscillating magnetic field around the microwave cavity. With the static magnetic field at full strength, the ESR spectrometer 84 detects the levels of the 9 GHz signal at the sample and produces a corresponding output signal that is transmitted to the computer system 52 on the lead 86. The computer system 52 processes the output signal produced by the ESR spectrometer, establishing the level of the ESR signal. The process is then repeated, except that the frequency of the rf energy is incrementally increased so that a plurality of measurements (data) are collected at successively higher rf frequencies, to determine the zero-field ESR spectrum for the sample.

In order for the method of the present invention to work, several experimental conditions must be met. First, the sample must be paramagnetic, a characteristic of substances that contain unpaired electrons. If the sample under study is not naturally paramagnetic, unpaired electrons can be introduced into the sample. For example, unpaired electrons are typically created in solid-state materials by exposing a substance to high energy X-rays for a period of time. The process of creating unpaired electrons with X-rays to produce the paramagnetic condition is well known in the art and therefore need not be discussed further.

Furthermore, the cycle time of switching the magnetic field must be less than the relaxation time of the sample. Because typical relaxation times for most substances are extremely short at room temperature, it is advantageous to cool the sample. In the present demonstration of the invention, the sample is cooled to 2K, the temperature regime of liquid helium. At this temperature, the electron spin lattice relaxation time is substantially increased. As a result, the magnetic field can be de-energized to bring the sample to zero field and reenergized without exceeding the relaxation time.

Figure 7:
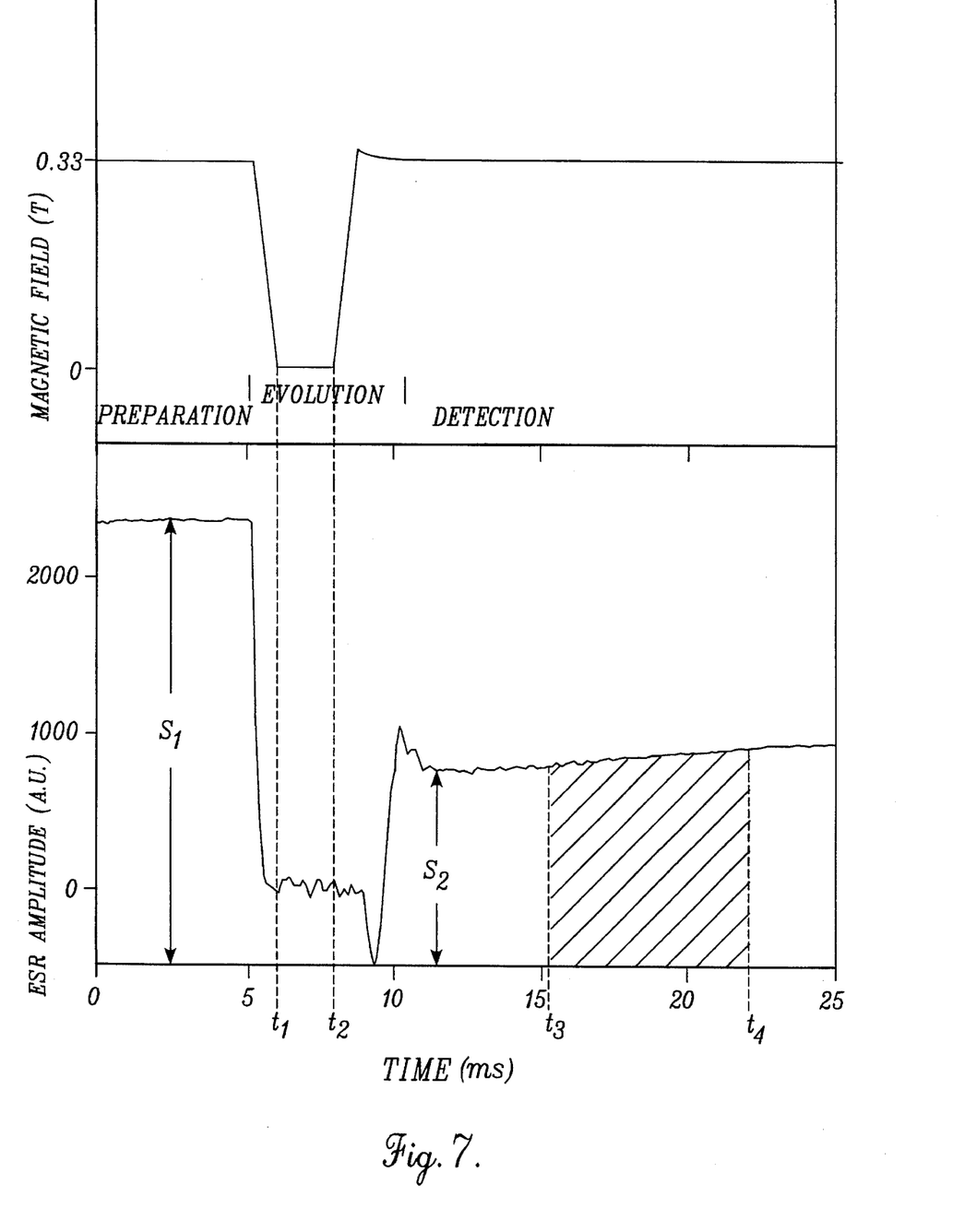
FIG. 7 is a timing diagram showing how a magnetic field is cycled in order to detect spin transitions in paramagnetic substances, which may be non-crystalline, according to a method of the present invention.

Finally, the maximum rate of change in the magnetic field strength must be much less than the Larmor frequency of the electron spins in the sample exposed to the magnetic field. The following equation defines the details of this requirement:

$$\frac{\left| B_0 x \frac{dB_0}{dt} \right|}{B_0^2} << \gamma B_0 \tag{2}$$

Where $B_0$ is the magnetic field strength and $\gamma$ is the magnetogyric ratio of the electron spin. Referring now to FIG. 7, the field cycling method of the present invention will now be described in greater detail. At the beginning of the experiment, the sample under investigation is placed in a high magnetic field. In the presently preferred embodiment of the invention, the magnetic field has a field strength of 0.33 Tesla. The sample is then exposed to an electromagnetic energy having a frequency of approximately 9 GHz. As will be appreciated by those skilled in the art, the particular frequency of the microwave energy used depends on the strength of the magnetic field. The sample remains in the high magnetic field for approximately five milliseconds before the magnetic field is rapidly turned off at a time $t_1$. At a time $t_2$, the magnetic field is rapidly reenergized back to the 0.33 Tesla level. The ESR signal is measured during a detection period that extends between times $t_3$ and $t_4$. The detection period is approximately 8 ms long, and begins approximately 7 milliseconds after the magnetic field is reenergized at the time $t_2$. However, the time for holding the sample in the high magnetic field and the detection time may be varied depending on the experimental equipment being used.

The ESR amplitude signal measured during the detection period defines a baseline that is used for comparison against an ESR signal obtained by exposing the sample to rf energy while the sample is at zero magnetic field. As can be seen in FIG. 7, the ESR signal detected before the magnetic field is reduced to zero at time $t_1$ is greater ($S_1$) than the ESR signal detected during the detection period ($S_2$). The difference in the detected ESR signals is due to electron relaxation processes, (i.e., the spontaneous repopulation of electrons at each level when the energy levels are brought closer together) that occur in the sample when the magnetic field strength is rapidly reduced.

The present invention takes advantage of the inventors' discovery that spin transitions induced by exposing the sample to rf energy at zero field can be detected as changes in the magnitude of the ESR signal, after the high magnetic field is restored. Therefore, to detect the spin transitions at zero B field, the sample is exposed to rf energy between the times $t_1$ and $t_2$ when the magnetic field is turned off. If the applied rf energy is in resonance with the energy difference of a spin transition or affects the zero field populations in some other manner, the population of the two zero-field levels will be changed and the detected ESR amplitude will differ from the baseline ESR signal (which measures differences in population) that was detected when the magnetic field was cycled without exposing the sample to rf energy at zero B field.

To demonstrate the principles outlined above, it is only necessary to cause some change in the electron spin populations. This can be done either directly by causing transitions between the zero-field energy levels by applying rf at the corresponding frequency, or indirectly by causing a disturbance in some other coupled spin system which in turn affects the populations of the high-field energy levels. We have chosen an indirect method to illustrate this described phenomenon. Strictly speaking, the indirect effect may not operate in zero-field. It is possible that pumping the deuteron transitions, which disturbs the steady state deuteron spin populations (or the deuteron pool spin temperature), does not directly alter the zero-field electron spin populations. Instead, that coupling may only occur later at some higher magnetic field. Nevertheless, the observation of a finite relaxation time at zero-field (reflecting some preservation of the high field populations), together with the ability to alter those populations by electromagnetic energy, encompasses the essential requirements for this methodology.

Figure 8:
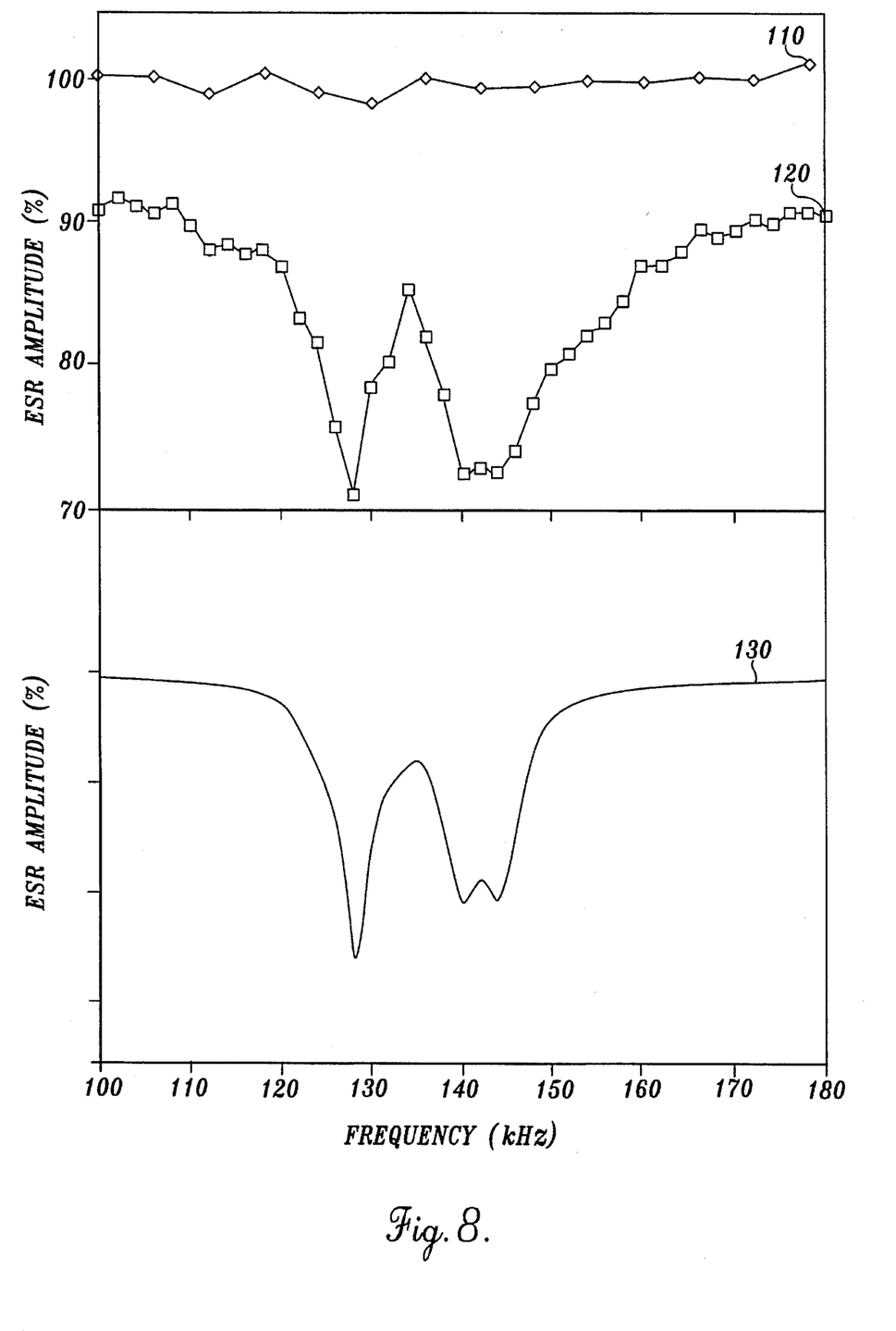
FIG. 8 is an ESR spectrum obtained according to the method of the present invention, showing multiple quadrupole transitions taking place in a substance having a single electron/proton pair as guests in a perdeuterated host.

FIG. 8 shows an actual plot of an ESR signal obtained at high magnetic field for a sample of perdeuterated malonic acid that was exposed to rf energy having a frequency that varied between 100–180 KHz, while the magnetic field was deenergized. Perdeuterated malonic acid was chosen as a test sample because it is a simple, well characterized substance. The experiment was performed by using electromagnetic energy in the frequency range from 100–180 KHz in order to induce spin state transitions in the deuterons because the deuteron spin changes produce a large effect on the electron spin levels, which makes it relatively easy to detect the effect. A baseline ESR signal 110 was established by measuring the ESR signal after the magnetic field had been cycled to zero without exposing the sample to rf energy. An ESR spectrum 120 was then produced by detecting the ESR signal after the sample was exposed while at zero B field to rf energy at varying frequencies. The spectrum 120 exhibits two significant dips at approximately 128 and 142 KHz. These frequencies correspond to two of the known spin transition frequencies for deuterons in malonic acid. A spectrum 130 is a computer simulation of the deuteron spin transitions that occur in zero field. As can be seen, the computer simulated spectrum 130 closely matches the experimentally determined spectrum 120. The experimental results shown in FIG. 8 represent quadrupole transitions in the deuteron nuclei with the electric field gradients produced by chemical bonds surrounding the nucleus. As indicated above, the experiment was performed to detect deuteron spin changes because they produced a large ESR signal change that is easily detected. However, the technique of the present invention can also be used to detect electron spin transitions that occur in zero field.

Figure 9:
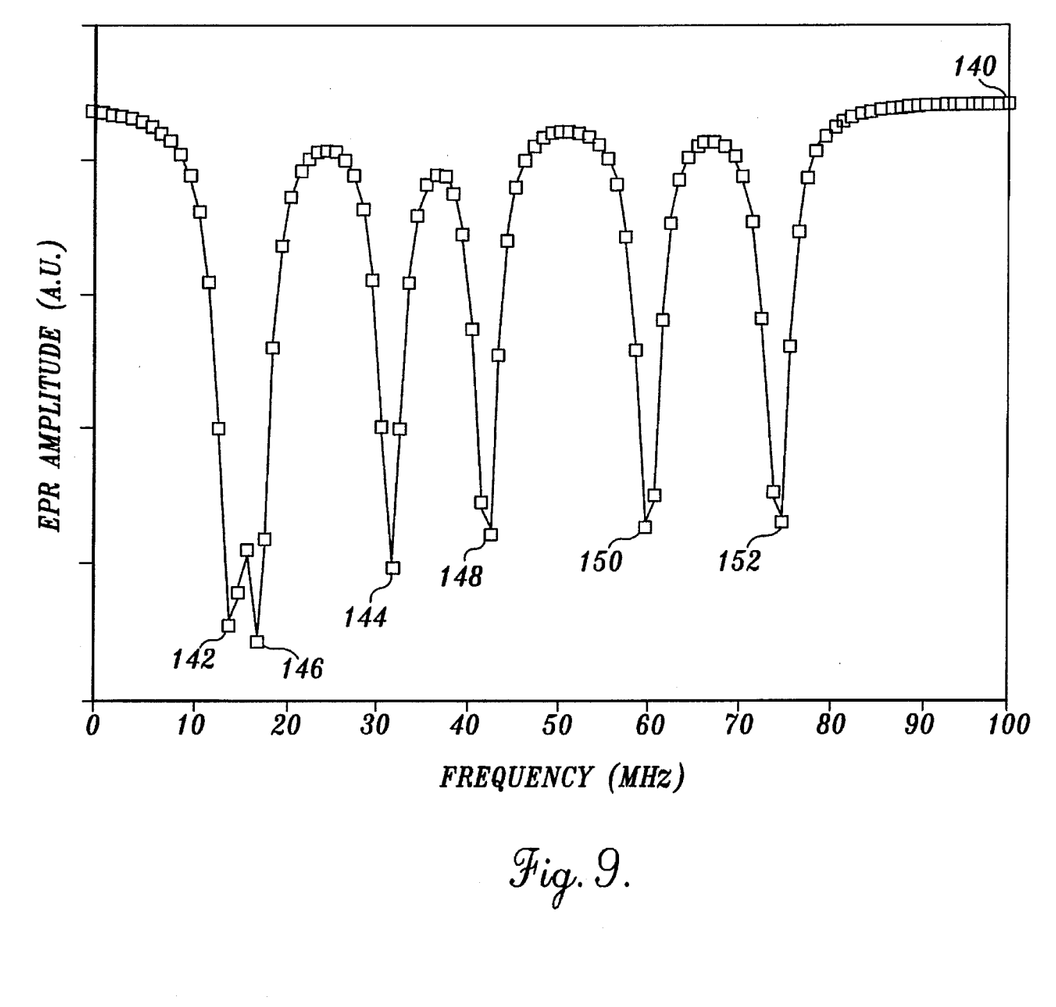
FIG. 9 is a theoretical ESR spectrum that should be obtained for a sample of malonic acid when analyzed according to the method of the present invention.

FIG. 9 shows a simulated ESR spectrum 140 for malonic acid, which the inventors believe would be obtained by plotting the ESR signal measured at high magnetic field versus the frequency of rf energy applied at zero field. The ESR spectrum 140 would be obtained as the rf energy is swept through the range of 10–100 MHz, in 2 MHz increments. The ESR spectrum 140 contains six lines 142–152 of high absorption that correspond to the six possible spin transitions for electron/nuclear pair in malonic acid.

The inventors have found that a double resonance technique can also be accomplished at zero field to improve the resolution with which transitions between energy levels are determined. To review the double resonance technique, reference is made to FIG. 10, where the four energy levels $L_1$–$L_4$ for a single electron/proton pair are shown. The population of spins at each level can be changed by "pumping" the substance with electromagnetic energy having a frequency that is in resonance with the energy of an allowed transition. For example, the number of spins in levels $L_1$ and $L_4$ can be changed by pumping the substance with electromagnetic energy that is in resonance with the energy difference for the level $L_1$–$L_4$ transition. This transition is indicated by the solid arrow 150. By pumping the system with such an electromagnetic signal, any transition involving levels $L_1$ or $L_4$, (indicated by the dashed arrows), will be altered. The only spin transition not affected by pumping the level $L_1$ to level $L_4$ transition is the transition from level $L_2$ to $L_3$, indicated by the small solid arrow 154. As will be appreciated, by selectively pumping the substance under test with electromagnetic energy having a frequency corresponding to the energy of different known transitions, it is possible to isolate certain transitions, thereby permitting a simpler analysis of the chemical substance under study. The benefit of isolating transitions in this manner becomes increasingly more significant as the number of protons (or nuclei) in the sample increases.

Figure 10:
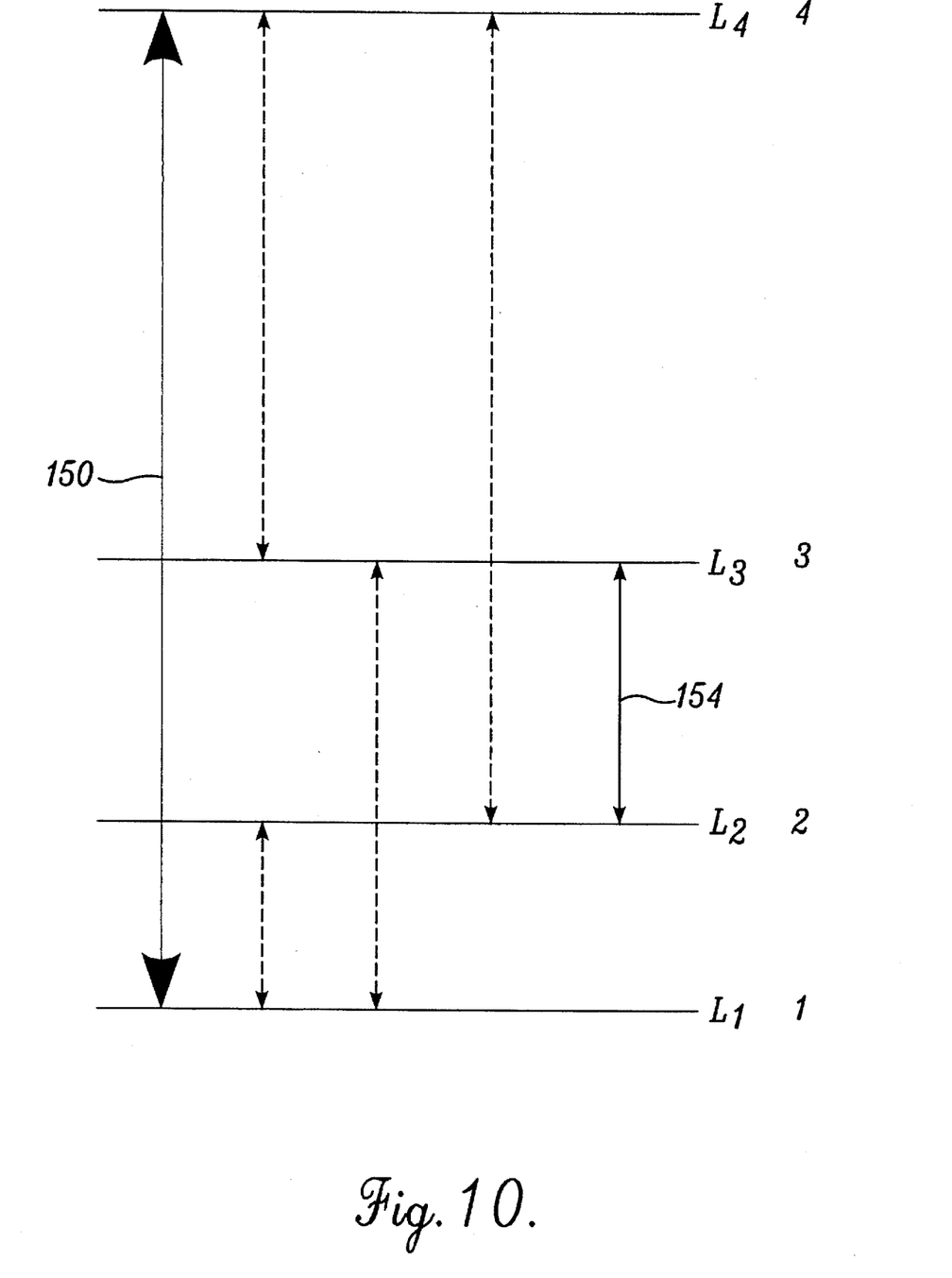
FIG. 10 is an energy level diagram for a chemical substance having a single electron/proton pair showing the principle employed in the double resonance technique.

To accomplish the double resonance technique in zero field, the substance is exposed to two different electromagnetic energies when the magnetic field strength is reduced to zero. The first electromagnetic energy is maintained at the frequency of a known spin transition, as shown in FIG. 10 and described above. The frequency of a second electromagnetic energy is varied over the range of frequencies allowed for all transitions, and the resulting ESR spectrum after the magnetic field is reenergized is determined.

Figure 11:
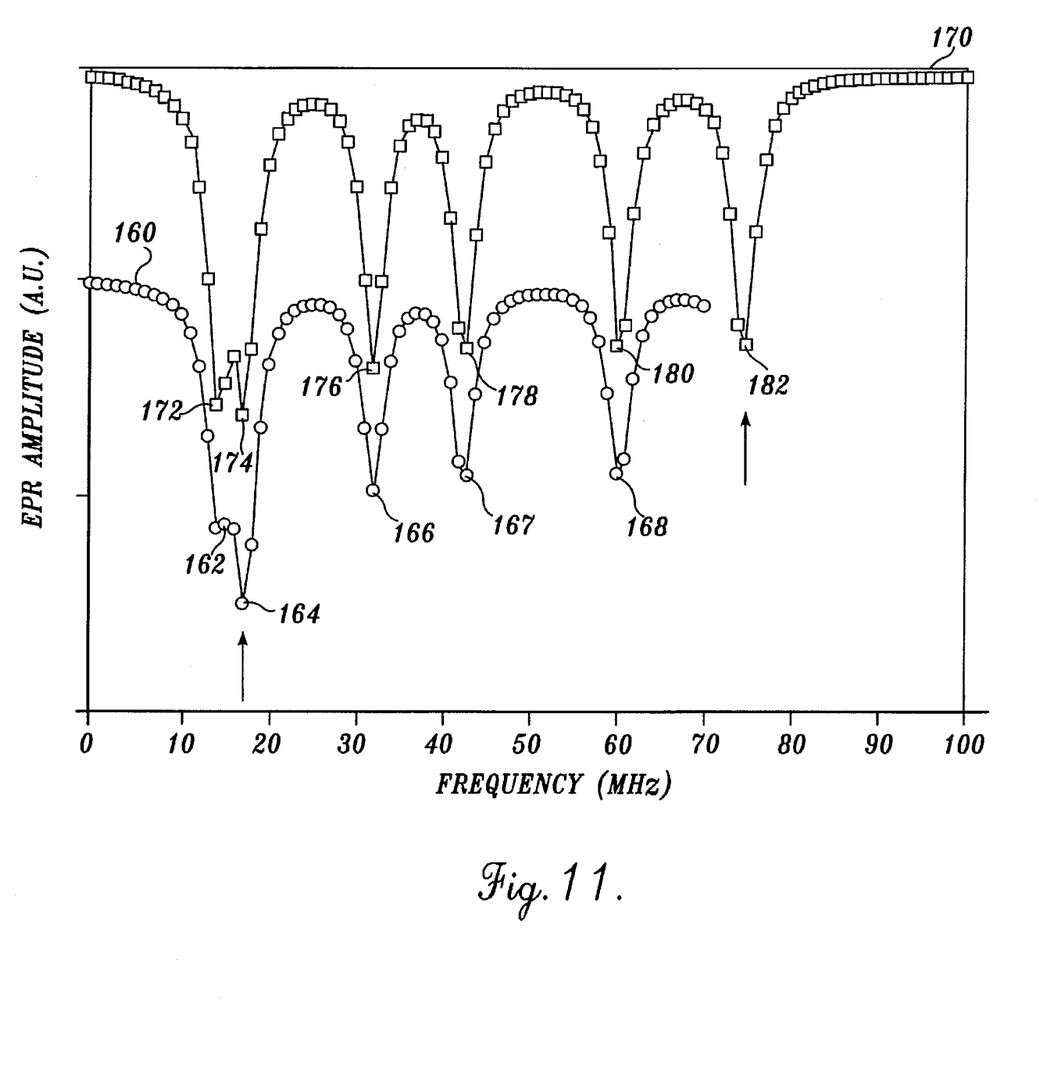
FIG. 11 is a theoretical ESR spectrum that should be obtained by performing a double resonance experiment on a sample of malonic acid according to the method of the present invention.

FIG. 11 shows a theoretical ESR spectrum that would likely be obtained for a sample of malonic acid when a double resonance experiment is performed at zero B field. Here, the sample would be exposed to electromagnetic energy having a constant frequency of approximately 78 MHz. This is the highest frequency spin transition. The sample would then be exposed to a second dose of electromagnetic energy having a frequency that is stepped from 0–100 MHz in 0.1–1.0 MHz increments. The ESR signal would be detected after the magnetic field has been reenergized. A plot of the frequency of the varying electromagnetic energy versus the magnitude of detected ESR signal should produce an ESR spectrum 160. This spectrum 160 is compared to a reference ESR spectrum 170 that is obtained without pumping the malonic acid with constant frequency rf energy at zero field. The two spectra 160 and 170 should actually overlap one another but are shown as offset so as to more easily to see how the ESR spectrum has changed.

The reference ESR spectrum 170 contains six absorption points 172, 174, 176, 178, 180 and 182 corresponding to the six possible spin transitions. The ESR spectrum 160 that should be obtained by pumping the largest spin transition contains five transitions 162, 164, 166, 167, 168 (the transition at which the system is being pumped is not detected). As can be seen by comparing the ESR spectrum 160 to the reference ESR spectrum 170, all the absorption points in the spectrum 160 are "more shallow" with the exception of the absorption point 164. As was described in connection with FIG. 10, the level $L_2$ to level $L_3$ spin transition is not affected by pumping the level $L_1$ to level $L_4$ transition, therefore we can see that the energy gap between levels $L_2$ and $L_3$ corresponds to the absorption point 164 and has a frequency of approximately 18 MHz. The other transitions can be identified by pumping the test substance with an electromagnetic signal having a frequency of another known transition.

In practice, the benefit of the double resonance technique is achieved not by observing the unaffected spin transitions, but by analyzing the affected transition. In general, the number of energy levels L for N nuclei of spin one-half is given by $L=2^{N+1}$ and the number of allowed zero field spin transitions is given by $L(L-1)/2$. Therefore, for a substance having 3 nuclei of spin one-half, there are 16 levels and 120 spin transitions. By pumping the largest transition, 28 other spin transitions are affected. The affected transitions can be readily identified and analyzed. Further reductions in the number of transitions can be made by inverting the populations of spins at the top and bottom electron levels. This effectively identifies half the spin transitions. Thus, by using the double resonance techniques, the number of zero field spin transitions can be reduced to a reasonable number for study and analysis.

As indicated above, the present invention is an improvement over the prior art ESR detection methods because transitions induced at zero field are detected at high field, thereby enabling non-crystalline, paramagnetic substances to be studied with high sensitivity and improved resolution. It was previously not possible (or at least not practical) to assign spin transitions in zero B field for any free radical substance having more than one or two protons strongly coupled to the unpaired electron. Additionally, the inventors have found that the effects of transitions induced at zero field can be detected in a magnetic field having a strength as low as 100 gauss. Therefore, the zero field ESR detection method of the present invention can be accomplished with smaller magnetic fields than had previously been used for prior art ESR experiments, and at much lower cost.

The present invention can also be used as a method for investigating the identity and electronic nature of unknown chemical substances. Each chemical substance has a characteristic ESR spectrum that can be used to differentiate the substance. To identify an unknown substance, its ESR spectrum can be detected according to the method of the present invention and the characteristic magnetic resonance parameters can be determined and compared to the theory and spectra of known substances. The benefit of the present invention is that it allows this novel magnetic resonance technique to be used to identify and characterize paramagnetic randomly oriented substances using high sensitivity and high resolution methods.

While the preferred embodiment of the invention has been illustrated and described, it will be appreciated that various changes can be made therein without departing from the spirit and scope of the invention. It is therefore intended that the scope of the invention be determined only from the following claims.

The embodiments of the invention in which an exclusive property or privilege is claimed are defined as follows:

1. A method for determining zero magnetic field spin resonance spectra of a paramagnetic substance, comprising the steps of:

(a) exposing the paramagnetic substance to an externally generated applied magnetic field;

(b) switching off the externally generated applied magnetic field for an interval of time that is substantially less than an electron spin-lattice relaxation time for the paramagnetic substance;

(c) reenergizing the magnetic field and determining the high field magnetic resonance characteristics of the paramagnetic substance as a baseline;

(d) repeating steps (a) through (c) except during the time interval, while the paramagnetic substance is not exposed to the externally generated applied magnetic field, applying radio frequency (rf) energy to the paramagnetic substance at a predetermined frequency;

(e) redetermining the magnetic resonance characteristics of the paramagnetic substance after the externally applied magnetic field is reenergized and noting any change in the high field magnetic resonance characteristics of the paramagnetic substance; and (f) repeating steps (a) through (e) using an incrementally different frequencies for the rf energy during each repetition, thereby determining the zero field spin resonance spectra of the paramagnetic substance.

2. The method of claim 1, wherein the substance does not have paramagnetic properties, further comprising the step of exposing the substance to irradiation by X-rays, thereby producing free radicals that create the paramagnetic properties of the substance.

3. The method of claim 1, further comprising the steps of cooling the paramagnetic substance to a temperature substantially below ambient, and maintaining the paramagnetic substance at the temperature during steps (a) through (e), said temperature being selected to ensure that the electron spin-lattice relaxation times are substantially longer than said time interval.

4. The method of claim 1, wherein the step of determining the high field magnetic resonance characteristics of the paramagnetic substance includes the steps of applying microwave energy to the paramagnetic substance at varying frequencies; and monitoring absorption of the microwave energy by the substance at specific frequencies that correspond to Zeeman transitions of unpaired electrons in the paramagnetic substance.

5. The method of claim 1, wherein the paramagnetic substance comprises a plurality of crystals, which may or may not be aligned.

6. A method for determining electron spin resonance characteristics of a substance containing paramagnetic components, during a time interval in which an externally generated applied magnetic field is switched off, said method comprising the steps of:

(a) cooling the substance to provide electron spin-lattice relaxation times for the substance that are substantially longer than said time interval;

(b) generating an applied magnetic field to which the substance is exposed, said magnetic field having a strength greater than a local field experienced by unpaired electrons in the substance in the absence of said magnetic field that is generated;

(c) switching off the applied magnetic field so that the externally generated applied magnetic field to which the substance is exposed rapidly decreases to substantially zero;

(d) exposing the substance to rf energy during the time at which the magnetic field is switched off;

(e) switching on the applied magnetic field after the time interval has elapsed;

(f) detecting an electron spin resonance signal from the paramagnetic substance after the magnetic field has been reenergized;

(g) repeating steps (b) through (f) using incrementally different frequencies for the rf energy, to determine the zero field spin resonance spectra for the substance.

7. The method of claim 6, further comprising the step of irradiating the substance with X-rays to produce free radicals that increase paramagnetic properties of the substance.

8. A method for determining zero magnetic field spin resonance spectrum of a paramagnetic substance, comprising the steps of:

(a) exposing the parmagnetic substance to an externally generated applied magnetic field;

(b) switching off the externally generated applied magnetic field for an interval of time that is substantially less than an electron-spin-lattice relaxation time for the paramagnetic substance;

(c) during the time interval, while the parmagnetic substance is not exposed to the externally generated applied magnetic field, applying a first dose rf energy to the paramagnetic substance;

(d) switching on the externally generated applied magnetic field and repeating step (a), noting any change in the high field magnetic resonance characteristics of the paramagnetic substance;

(e) detecting an electron spin resonance signal produced by the substance after the magnetic field has been switched back on;

(f) repeating steps (a) through (e) using an incrementally different frequency for the first dose of rf energy to produce a first zero field spin resonance spectra for the paramagnetic substance;

(g) determining from the first zero field spin resonance spectra the frequency of at least one spin transition for the parmagnetic substance;

(h) repeating steps (a) through (f) and additionally applying a second dose of rf energy having another frequency of the known spin transitions of the paramagnetic substance to determine a second zero-field double spin resonance spectrum for the paramagnetic substance; and (i) comparing the first and second spin resonance spectra.

9. A method for determining electron spin resonance characteristics of a substance containing parmagnetic components, during a time interval in which an externally generated applied magnetic field is switched off, said method comprising the steps of:

(a) cooling the substance to provide electron spin-lattice relaxation times for the substance that are substantially longer than said time interval;

(b) generating an applied magnetic field to which the substance is exposed, said magnetic field having a strength greater than a local field experienced by unpaired electrons in the substance in the absence of said magnetic field that is generated;

(c) exposing the substance to microwave energy at varying frequencies to determine electron spin transitions while the substance is exposed to the magnetic field, said electron spin transitions comprising baseline high field electron spin resonance characteristics for the substance;

(d) switching off the applied magnetic field so that the externally generated applied magnetic field to which the substance is exposed rapidly decreases to substantially zero;

(e) exposing the substance to rf energy at a first frequency and at a second frequency that is different than the first frequency during the time interval;

(f) switching on the applied magnetic field;

(g) repeating step (c), to determine changes in the Zeeman electron spin energy transitions relative to the baseline high field electron spin resonance characteristic for the substance, said changes corresponding to the zero field spin transitions;

(h) repeating steps (d) through (f) using incrementally different frequencies for at least one of the first and the second frequencies of the rf energy, to identify a set of zero field transitions that is less than all of the allowed zero field spin transitions.

* * * * *